(12) United States Patent
Liou

(10) Patent No.: US 6,326,673 B1
(45) Date of Patent: Dec. 4, 2001

(54) METHOD AND STRUCTURE OF MANUFACTURING A HIGH-Q INDUCTOR WITH AN AIR TRENCH

(75) Inventor: Ping Liou, Hsinchu (TW)

(73) Assignee: Windbond Electronics Corp., Hsinchu (TW)

( * ) Notice: Subject to any disclaimer, the term of this patent is extended or adjusted under 35 U.S.C. 154(b) by 0 days.

(21) Appl. No.: 09/260,597

(22) Filed: Mar. 2, 1999

(30) Foreign Application Priority Data

Aug. 7, 1998 (TW) .................................. 87113023

(51) Int. Cl.[7] .............................................. H01L 21/8222
(52) U.S. Cl. ........................... 257/531; 257/499; 257/528
(58) Field of Search .................................. 257/531, 528, 257/529, 499

(56) References Cited

U.S. PATENT DOCUMENTS 5,793,272 * 8/1998 Burghartz et al. .
6,015,742 * 1/2000 Ju .

* cited by examiner

*Primary Examiner*—Kevin M. Picardat
*Assistant Examiner*—D. M. Collins
(74) *Attorney, Agent, or Firm*—Jiawei Huang; J.C. Patents

(57) ABSTRACT

The structure of high-Q inductor applied in a monolithic circuit according to the invention comprises a plurality of spiral metal lines and a plurality of dielectric layers, each dielectric layer formed between two adjacent spiral metal lines. Furthermore, via plugs are formed in each dielectric layer to electrically connect two adjacent spiral metal lines. A spiral air trench is formed along the spacing of the spiral metal lines in the dielectric layers. Therefore, 3D-structure of the inductor of the invention can greatly reduce the series resistance thereof without widening the spiral metal lines. In addition, the spiral air trench, filled with air which has a lower dielectric constant, can efficiently reduce the parasitic capacitance between the spacing of the spiral metal lines. As a result, the inductor of the invention has a higher quality factor at a proper RF operating frequency region.

6 Claims, 13 Drawing Sheets

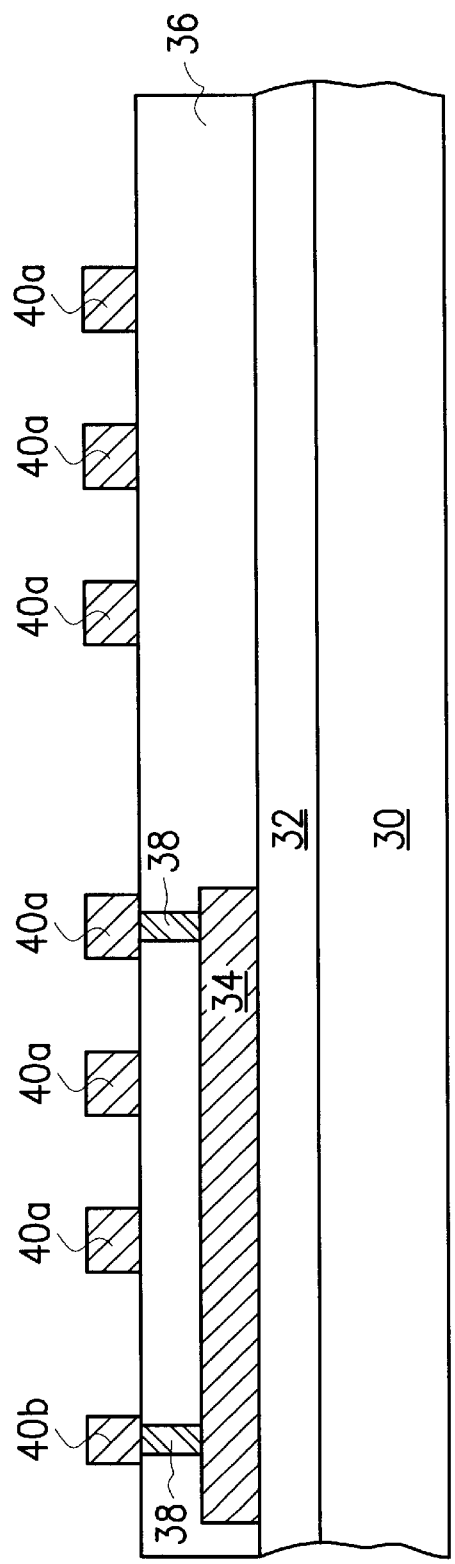
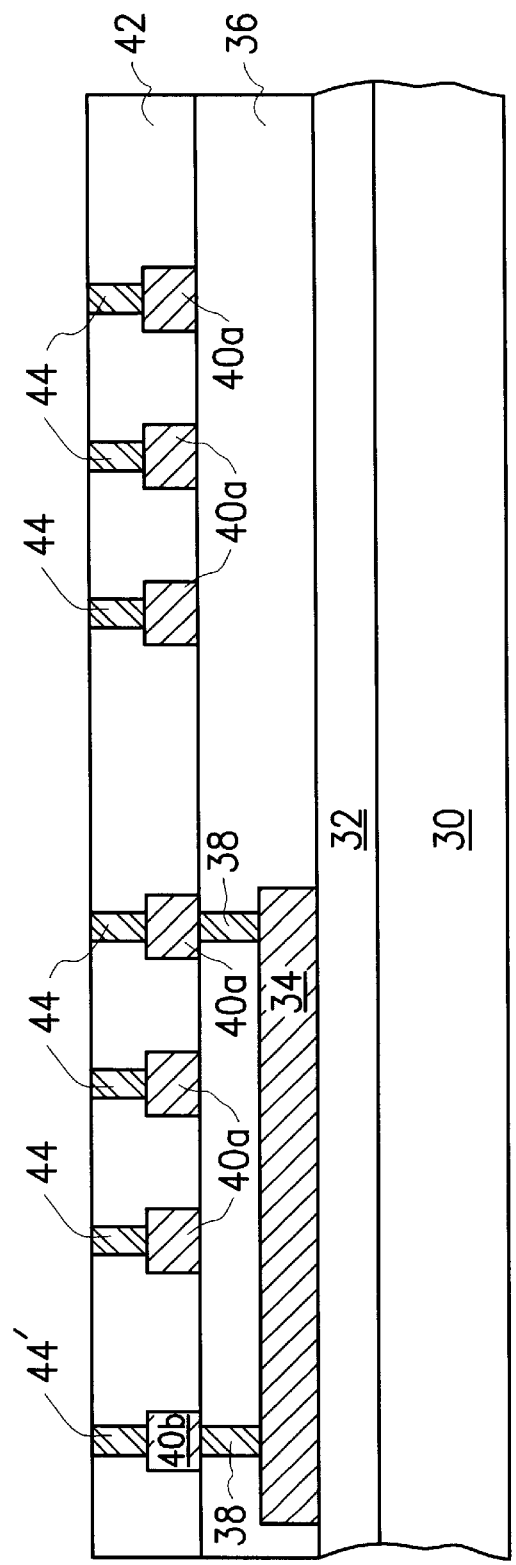
FIG. 3C
FIG. 3D

METHOD AND STRUCTURE OF MANUFACTURING A HIGH-Q INDUCTOR WITH AN AIR TRENCH

CROSS-REFERENCE TO RELATED APPLICATION

This application claims the priority benefit of Taiwan application Ser. No. 87113032, filed Aug. 7, 1998, the full disclosure of which in incorporated herein by reference.

BACKGROUND OF THE INVENTION

1. Field of the Invention

The invention relates to a method and a structure of manufacturing an inductor in an monolithic circuit, and more particularly to a method and a structure of manufacturing an inductor with a high-quality factor and an air trench.

2. Description of the Related Art

The continuous miniaturization of integrated circuits (ICs) is a main trend in the semiconductor industry for the purpose of not only obtaining smaller sizes and lighter weights but also reducing manufacturing costs. Today, many digital circuits and analog circuits, such as complicated microprocessors and operational amplifiers, have been successfully mass produced into ICs by very large scale integrated (VLSI) technology. In general, the above-mentioned circuits include active devices, such as bipolar junction transistors (BJTs), field effect transistors (FETs) and diodes, and passive devices, such as resistors and capacitors.

However, miniaturization techniques have not been completely developed yet for certain circuits applied in specific areas, including, for example, radio frequency (FR) circuits, which are applied in communication equipment, such as cellular telephones (i.e., mobile telephones), cordless telephones, wireless modems and so on. Miniaturization of the RF circuits hinges on the ability to manufacture inductors with an appropriately high quality factor. Currently, the quality factor of inductors manufactured by semiconductor technology is less than 5, which does not meet desirable requirements. Although certain low-resistance metals, such as gold, can be used to increase the quality factor, it cannot be implemented by the current semiconductor technology.

It is well know that the quality factor represents the qualities of produced inductors. It can be estimated by the following formula:

$$Q = K \frac{\omega L}{R_s}$$

wherein $\omega$ is angle frequency, L is inductance, and $R_S$ is series resistance. Under an ideal condition, the quality factor Q of a non-loss inductor ( that is, R=0) is approximately infinite. Even though it is impossible to manufacture the ideal inductor in the real world, an inductor with a high quality factor can be definitely obtained by decreasing the energy losses thereof.

Referring to FIG. 1, an equivalent circuit of a real inductor is shown. It can be considered that the real inductor consists of an ideal inductor L, a resistor $R_S$ and a capacitor $C_d$, wherein the ideal inductor L and the resistor $R_S$ are connected to each other in series and then are coupled to the capacitor $C_d$ in parallel. Generally, the resistor $R_s$ of a spiral metal line used for forming the real inductor is considered to be a main factor in reducing the quality factor thereof. One way to resolve this problem is to widen the metal line. However, this increased the area occupied by the metal line and the parasitic capacitance $C_d$ that follows. It is obvious that the increased area is opposed to the miniaturization of the inductor. The parasitic capacitance decreases the self-resonance frequency of the inductor, which, as a result, limits the range of the operating frequency thereof. On the other hand, the quality factor Q is directly proportional to the angle frequency and is inversely proportional to the series resistor, so the metal line cannot be optionally widened.

SUMMARY OF THE INVENTION

In view of the above, an object of the invention is to provide a method and a structure of manufacturing an inductor with a high quality factor and an air trench in a monolithic circuit. The inductor manufactured by the invention has lower series resistance and a lower parasitic capacitance. Therefore, the inductor of the invention has lower energy losses, a higher quality factor and a higher operating frequency.

To attain the above-stated object, an inductor in a monolithic circuit according to the invention has the following structure. A plurality of spiral metal lines formed over a substrate. A plurality of dielectric layers, each of which is formed between two adjacent spiral metal lines. A plurality of via plugs formed in the dielectric layers to connect two adjacent spiral metal lines to each other. A spiral air trench formed along the spacing of the spiral metal lines in the dielectric layers. In such a structure having a plurality of spiral metal lines stacked on each other with the via plugs therebetween, the series resistance thereof is greatly decreased without widening the inductor. Moreover, air contained in the spiral air trench with a lower dielectric constant can efficiently reduce the parasitic capacitance of the inductor. Hence, the inductor manufactured based on the structure has a higher quality factor.

A method of manufacturing an inductor according to the invention comprises the following steps. A plurality of spiral metal lines aligned with each other is formed over a substrate. A plurality of dielectric layers, each of which is located between two adjacent spiral metal lines, is formed over the substrate. A via plug is formed in each dielectric layer to connect two adjacent spiral metal lines. An upper dielectric layer is formed over the spiral metal lines. A spiral air trench is formed in the dielectric layers along the spacing of the of the spiral metal lines.

BRIEF DESCRIPTION OF THE DRAWINGS

The invention will be more fully understood from the detailed description given hereinbelow and the accompanying drawings, which are given by way of illustration only, and thus do not limit the present invention, and wherein:

FIGS. 3A–3H are cross-sectional views illustrating a method of manufacturing an inductor according to the preferred embodiment of the invention;

DETAILED DESCRIPTION OF THE EMBODIMENTS

Figure 1:
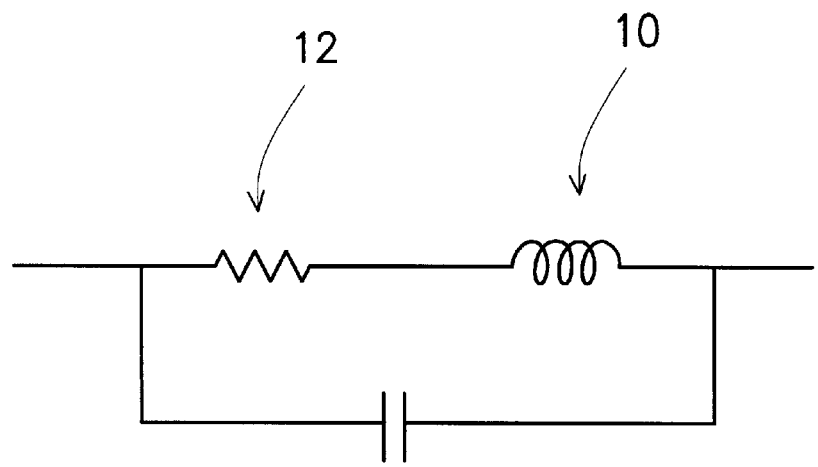
FIG. 1 is a schematic circuit diagram illustrating an equivalent circuit of a real inductor.
Figure 2:
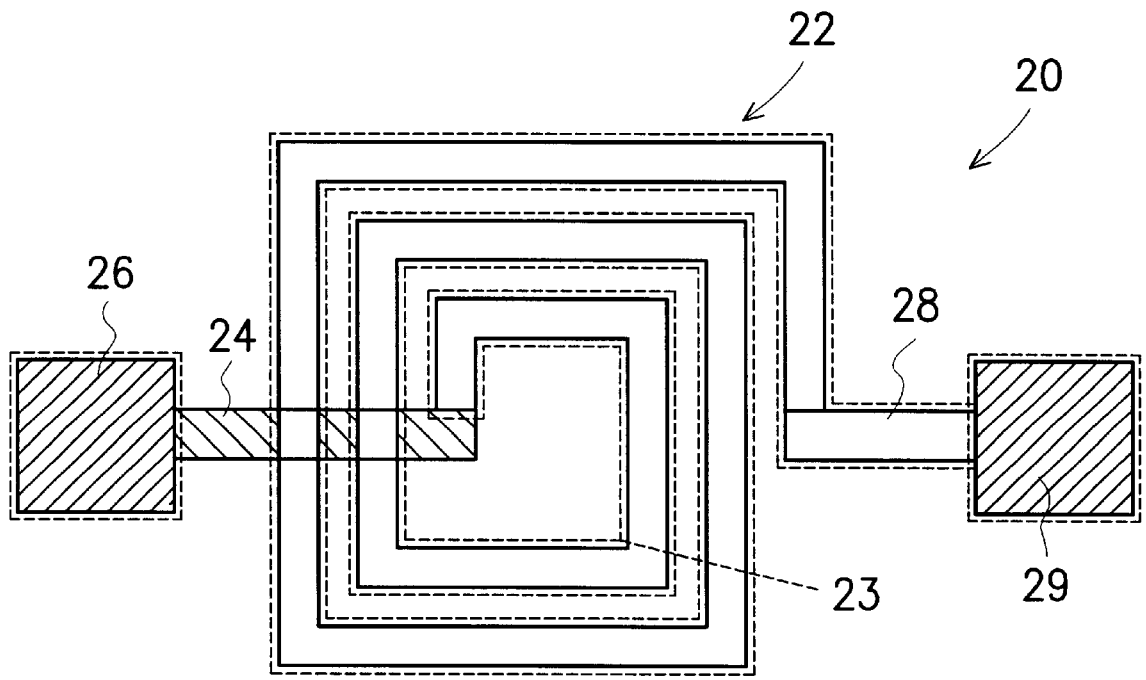
FIG. 2 is top view illustrating an inductor manufactured by a preferred embodiment of the invention.

FIG. 2 is a top view of an inductor manufactured by a preferred embodiment of the invention. In FIG. 2, an inductor 20 formed on a semiconductor substrate includes a spiral conductive line 22. One end of the spiral conductive line 22 is electrically connected to a first bonding pad 26 via a first connective line 24 while the other end thereof is electrically connected to a second bonding pad 29 via a second connective line 28. The bonding pads 26 and 29 are used to electrically connect other circuits. A spiral air trench 23 (indicated by a dash line) is formed along the gap of the spiral conductive line 22 to reduce the parasitic capacitance thereof and increase the quality factor thereof.

Figure 3A:
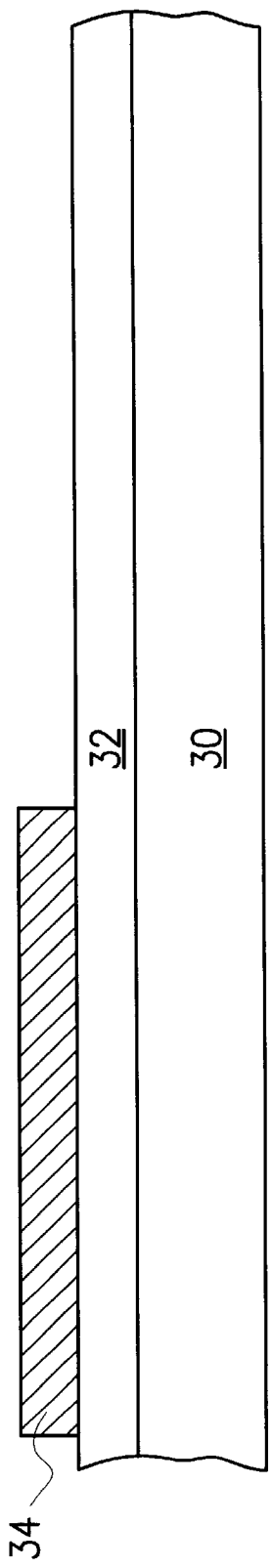

Referring to FIGS 3A–3H, a method of manufacturing an inductor according to a preferred embodiment of the invention is shown. In FIG. 3A, a lower metal line 34, such as an aluminum line is formed by sputtering and photolithography on an insulator 32, such as a silicon oxide layer, which is deposited on a substrate 30, such as a silicon substrate. The lower metal line 34 serves as a first connective line.

Figure 3B:
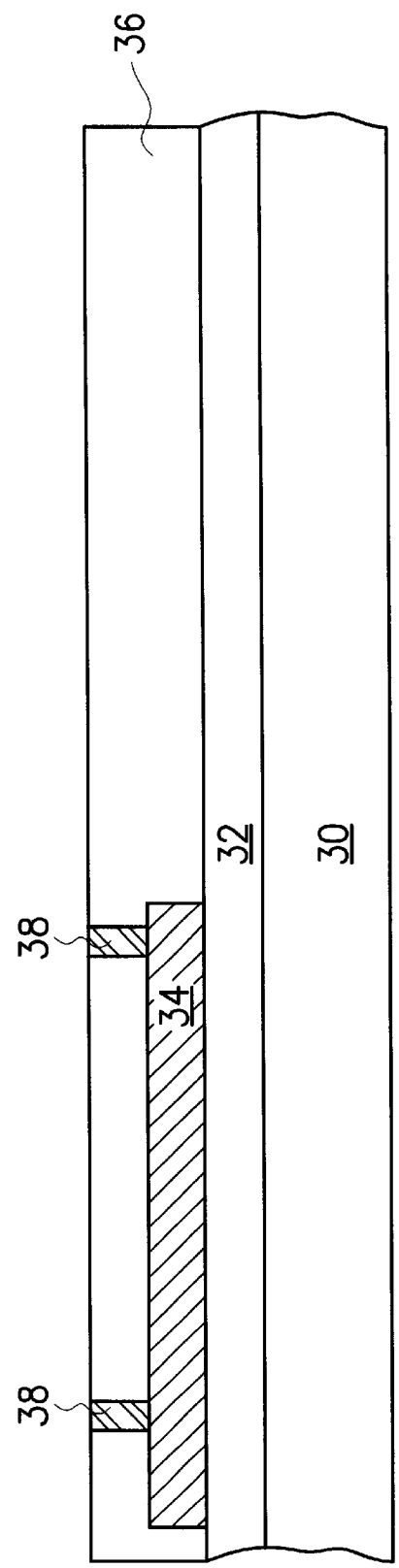

Referring to FIG. 3B, a lower dielectric layer 36, such as a silicon oxide layer, is formed on the insulator 32 and the lower metal line 34 by, for example, chemical vapor deposition (CVD). It is then planarized by, for example, etch back or chemical mechanical polishing (CMP) to facilitate subsequent photolithography. The lower dielectric layer 36 is patterned to form via holes (not shown) by, for example, photolithography and etching until portions of the surface of the lower metal line 34 are exposed. Next, a metal layer (not shown), such as a tungsten layers, is formed over the substrate 30 by, for example, chemical vapor deposition; it completely fills the via holes to electrically connect the lower metal line 34 ( which serves as the first connective line). Then, part of the metal layer above the level of the lower dielectric layer 36 is removed by planarization form first via plugs 38, such as tungsten plugs, by, for example, chemical mechanical polishing of etch back.

Referring to FIG. 3C, a first spiral metal line 40a and a first metal line 40b, such as a square spiral aluminum line and an aluminum line, are formed on the lower dielectric layer 36 by, for example sputtering and photolithography. As shown in FIG 3C, the first metal line 40b and the inner end of the spiral metal line 40a are connected to the lower metal line 34 (i.e., the first connective line) via the first via plugs 38.

Referring to FIG. 3D, a first dielectric layer 42, such as a silicon oxide layer, is formed on the spiral metal line 40a, the first metal line 40b and the lower dielectric layer 36 by, for example, chemical vapor deposition. It is then planarized by, for example, etch back or chemical mechanical polishing to facilitate subsequent photolithography. Next, the first dielectric layer 42 is patterned to form via holes (not shown) by, for example, photolithography and etching, until the first spiral metal line 40a and the first metal line 40b are exposed. A metal layer (not shown), such as a tungsten layer, is formed over the substrate 30 and completely fills the via holes by, for example, chemical vapor deposition. Part of the metal layer above the level of the first dielectric layer 42 is removed to form second via plugs 44 and a third via plug 44', such as tungsten plugs, in the via holes by, for example, chemical mechanical polishing or etch back, thereby connecting the spiral-shaped metal line 40a and the first metal line 40b, respectively.

Figure 3E:
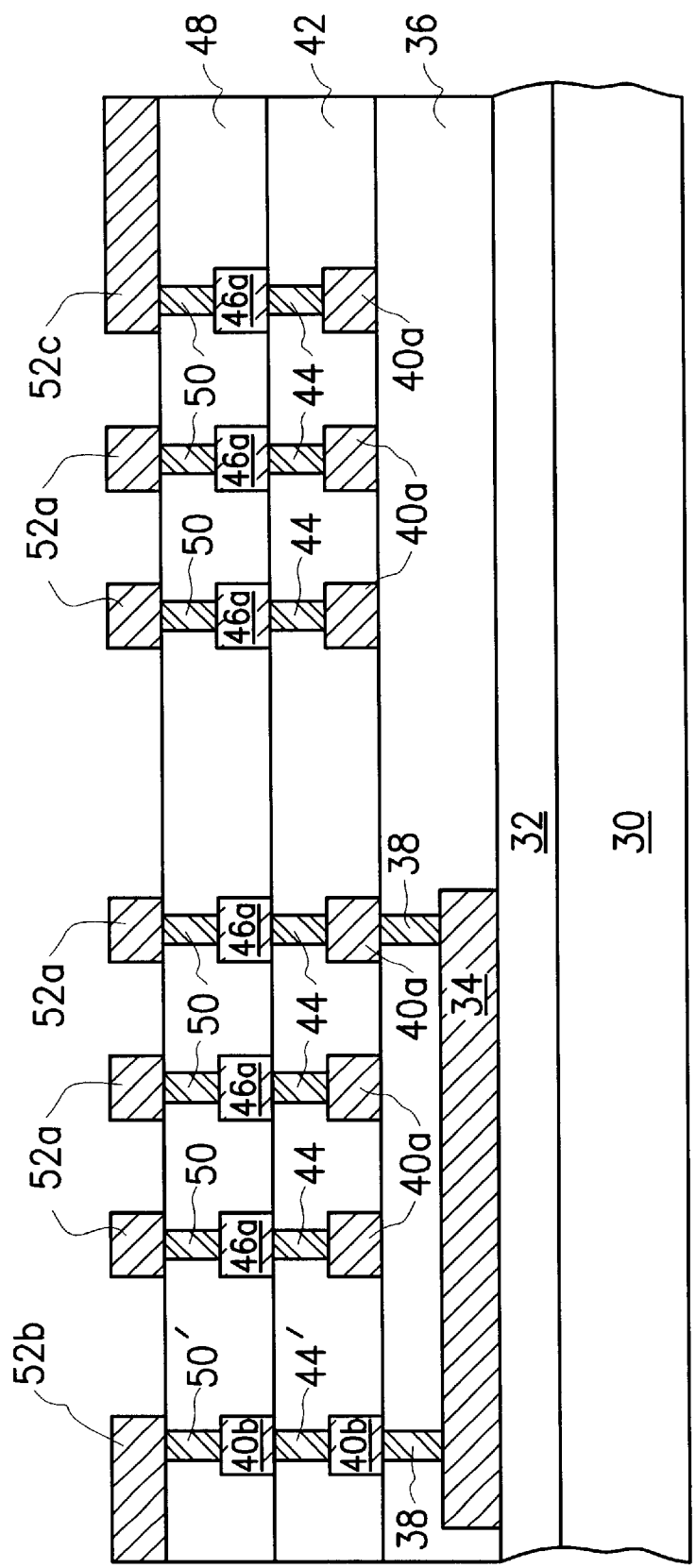

Referring to FIG. 3E, the steps shown in FIGS. 3C and 3D are repeated to form a second spiral metal line 46a on the second via holes 44, a second metal line 46b on the third via plug 44', a second dielectric layer 48 on the first dielectric layer 42, the second spiral metal line 46a and the second metal line 46b, fourth via plugs 50 on the second spiral metal line 46b and a fifth via plug 50' on the second spiral metal line 46a. Therefore, a third spiral sluminum line 52 a, such as a square spiral metal line, is formed on the fourth via plugs 50; a third metal line 52b, such as an aluminum layer is formed on the fifth via plug 50'; and a second connective line 52c, such as an aluminum layer, is formed on the fourth via plug 50 just above the outer end of the second spiral metal line 46a by, for example, sputtering, photolithography and etching. Moreover, the third metal line 52b electrically connects the lower metal line 34 (i.e., the first connective line) and the first bonding pad 26 as shown in FIG. 2, while the second connective line 52c is electrically connected to the second bonding pad 29 as shown in FIG. 2.

Figure 3F:
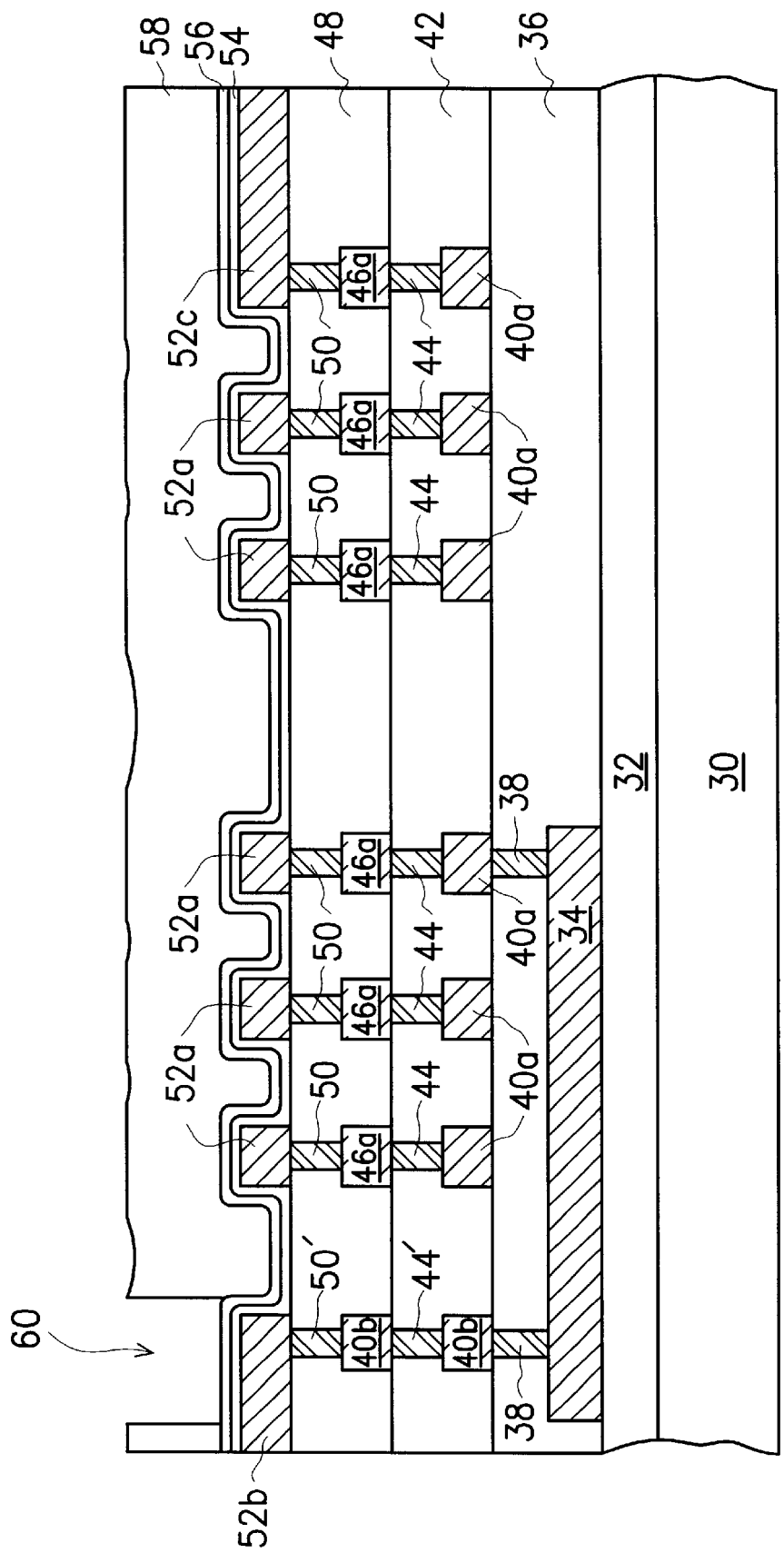

Referring to FIG 3F, an upper dielectric layer, consisting, for example, of a silicon oxide layer 54 and a silicon nitride layer 56, is formed on the third spiral metal line 52b, the third metal line 52b and the second connective line 52c by, for example, chemical vapor deposition. Then, a positive photoresist 58 having a trench 60 just above the third metal line 52b is formed on the silicon nitride layer 56 by photolithography. Parts of the silicon oxide layer 54 and the silicon nitride layer 56 just below the trench 60 are removed to expose the third metal line 52b by etching for subsequently bonding.

Figure 3G:
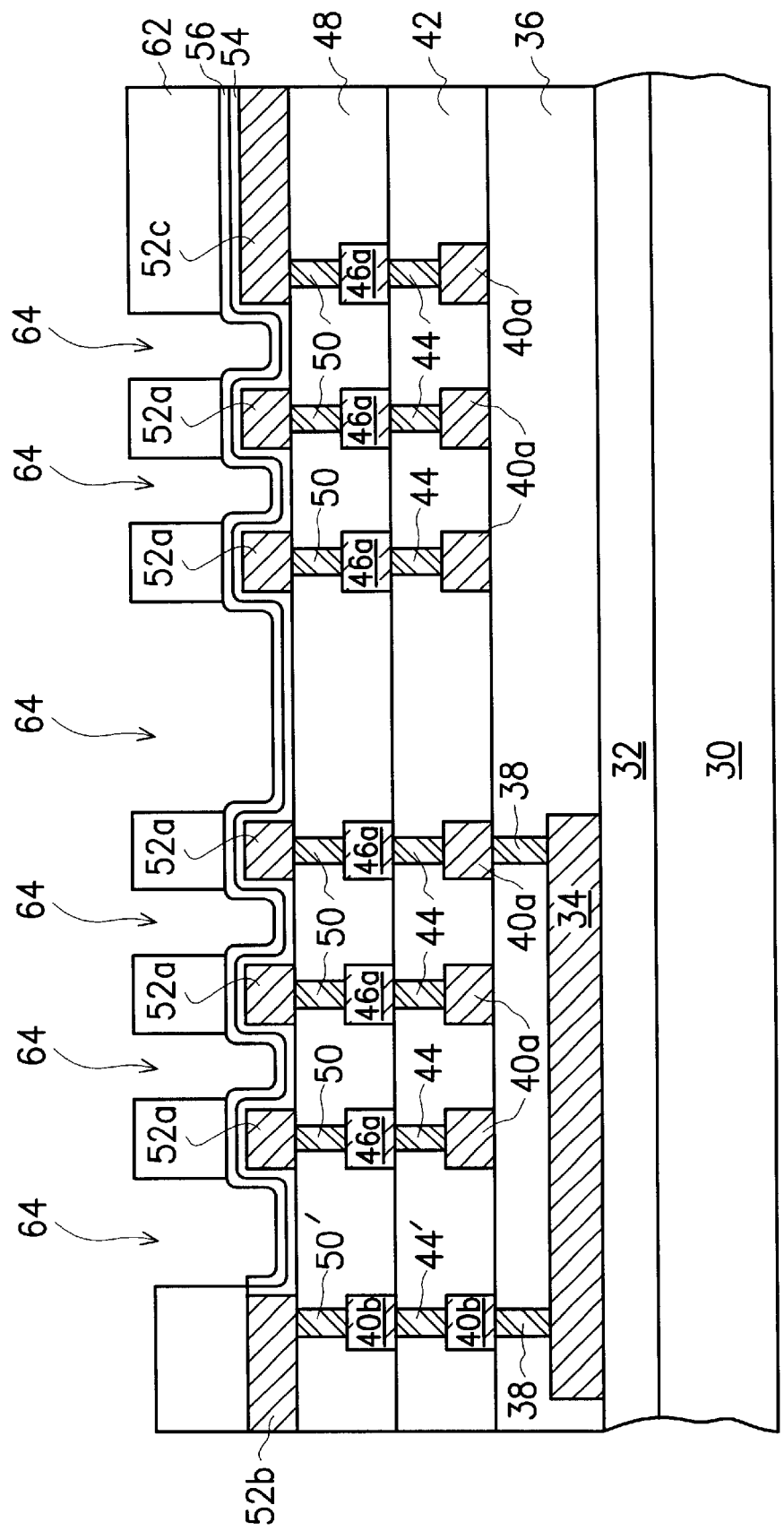
Figure 3H:
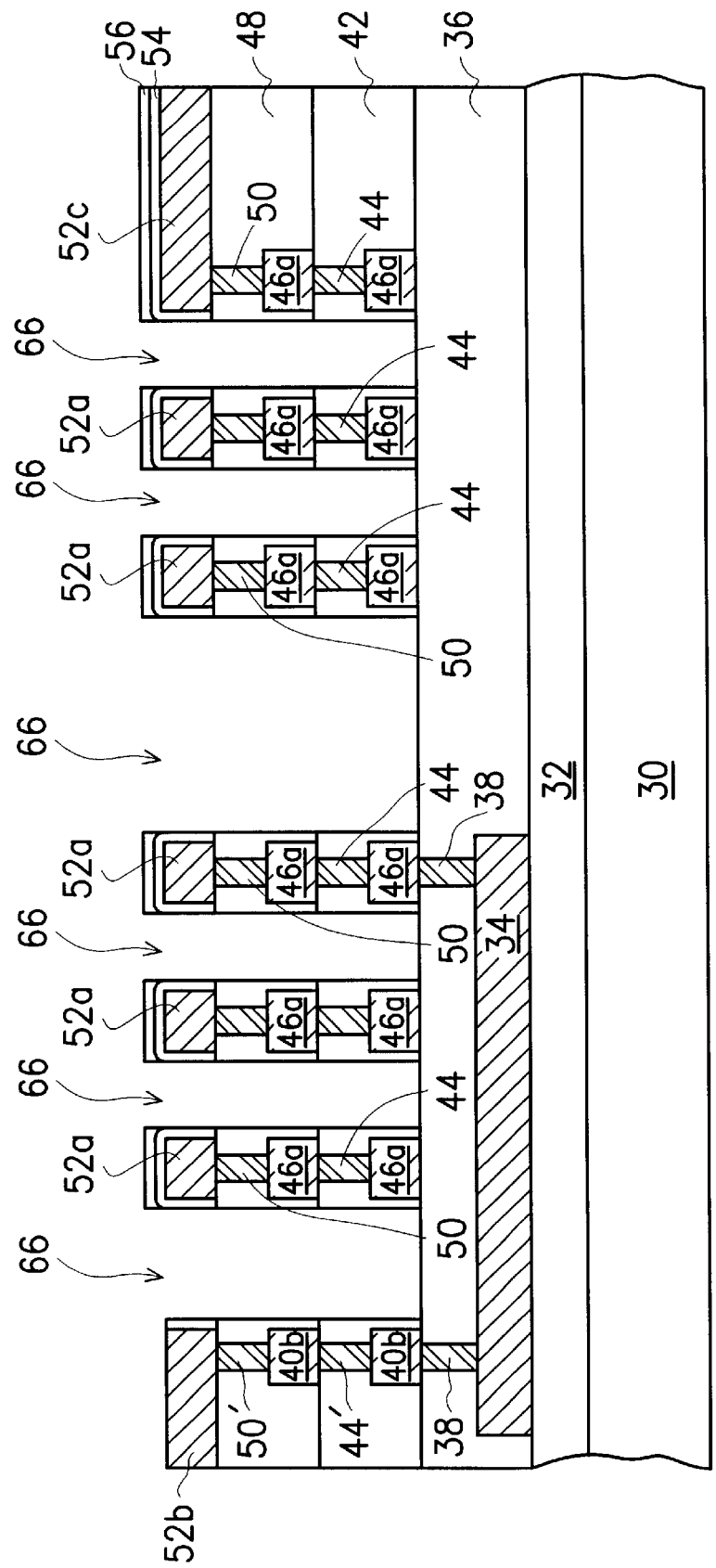

Referring to FIG. 3G, the positive photresist 58 is removed. Next a positive photoresist 62, having a spiral trench 64 aligned with the gaps of the third spiral metal line 52a, the third metal line 52b and the second connective line 52c, is formed on the silicon nitride layer 56 and the third metal line 52b. The spiral trench 62 keeps an appropriate distance from the third spiral metal line 52a by using an original mask for the formations of the spiral metal lines 40a, 46a and 52a and by adjusting its exposure dose to create a photo bias during development. This step can save a one-mask cost. Referring to FIG. 3H, parts of the silicon nitride layer 56, the silicon oxide layer 54 and the dielectric layers 48 and 42 uncovered by the positive photoresist 62 are removed to expose the lower dielectric layer 36 by etching, thereby forming a spiral air trench 66. Thus, the inductor according to the invention is completely manufactured.

Although the third metal line 52b is first exposed, and then the spiral air trench 66 is formed, it is obvious, for those skilled in the art that the order of the above-stated two steps is exchangeable. That is, the spiral air trench 66 can be first formed before the third metal line 52b is exposed. Moreover, to protect the sidewalls of the spiral air trench 66, another silicon nitride layer (not shown) can be formed on the inner surfaces thereof.

Figure 4A:
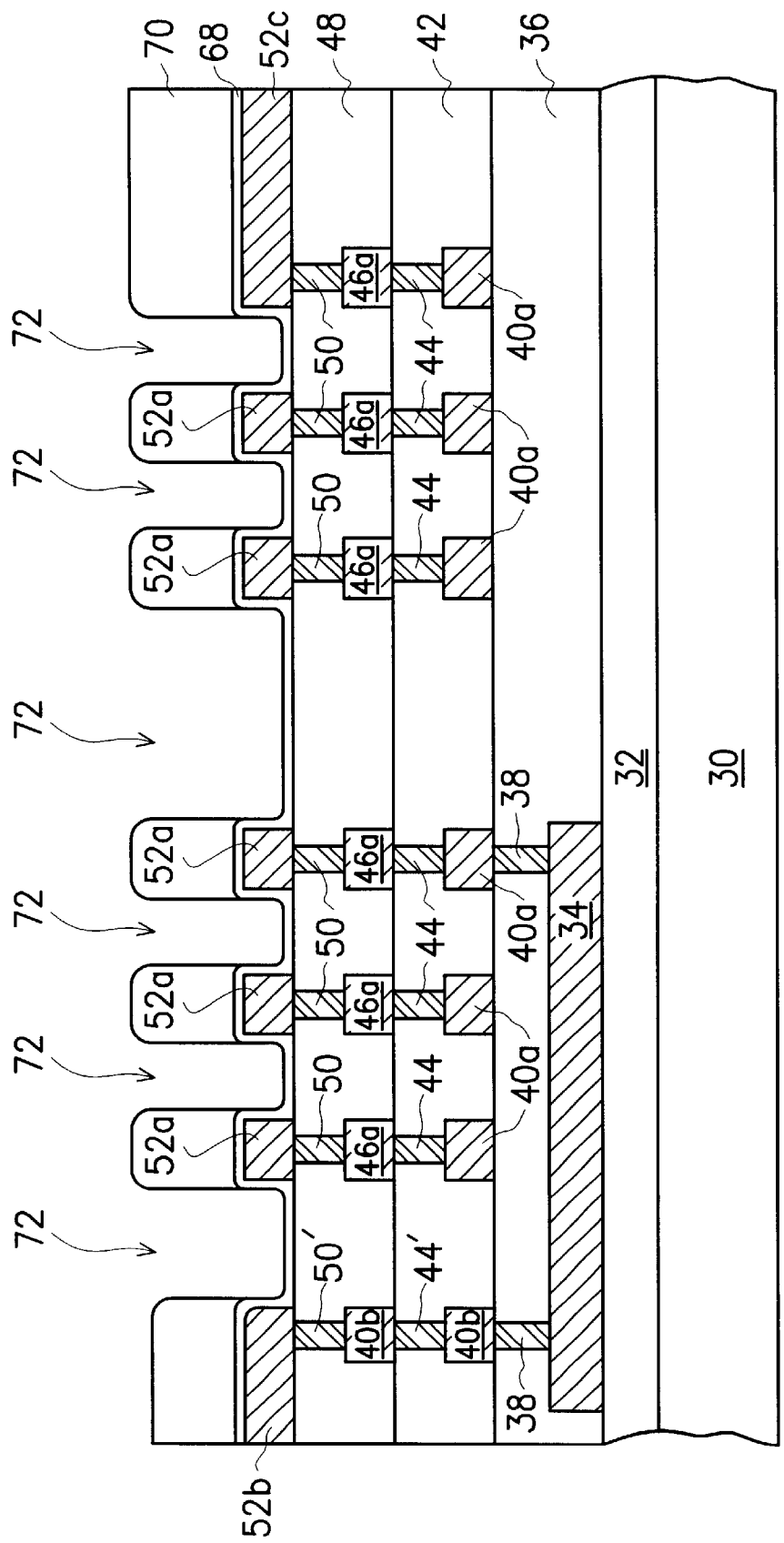
FIGS. 4A–4C are cross-sectional views illustrating another method of forming a spiral air trench after the step shown in FIG. 3E.
Figure 4B:
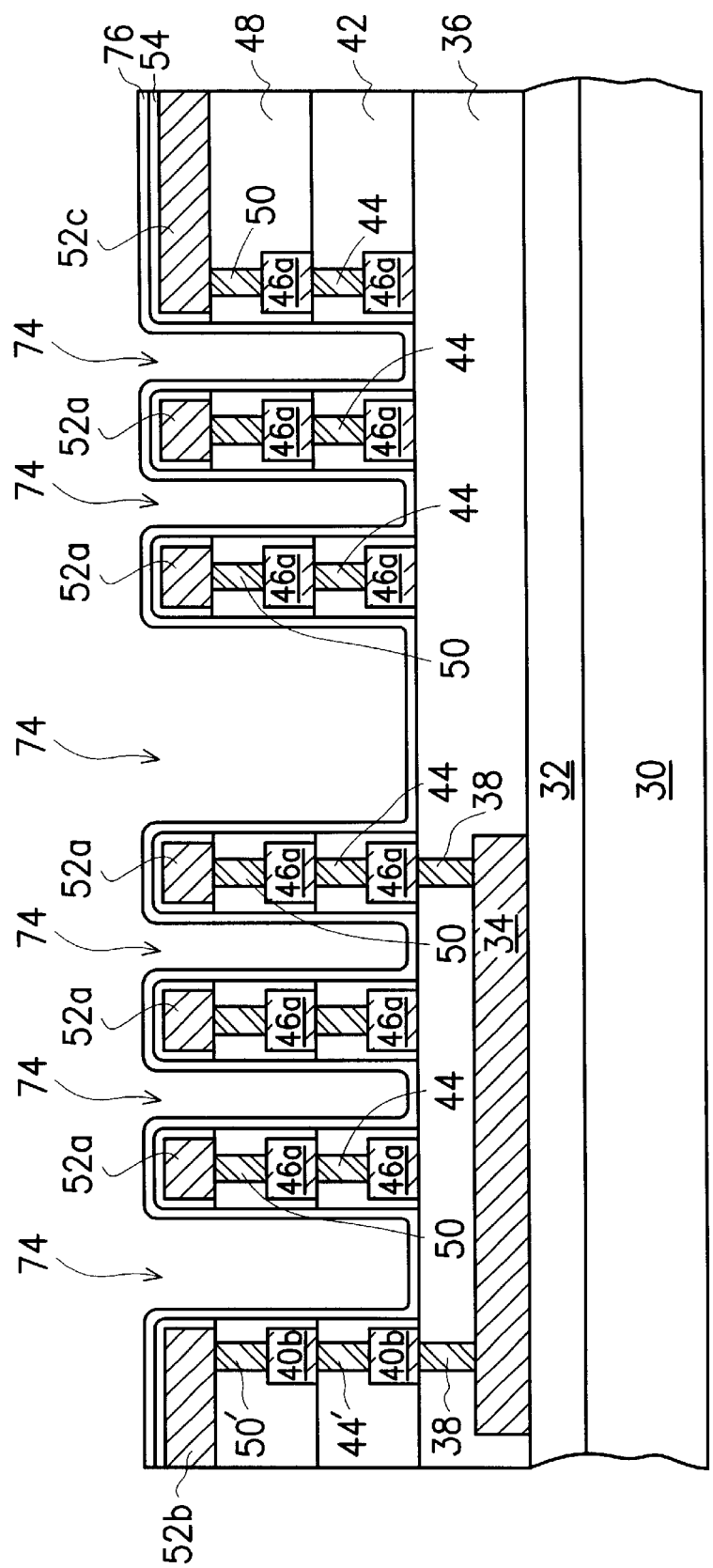
Figure 4C:
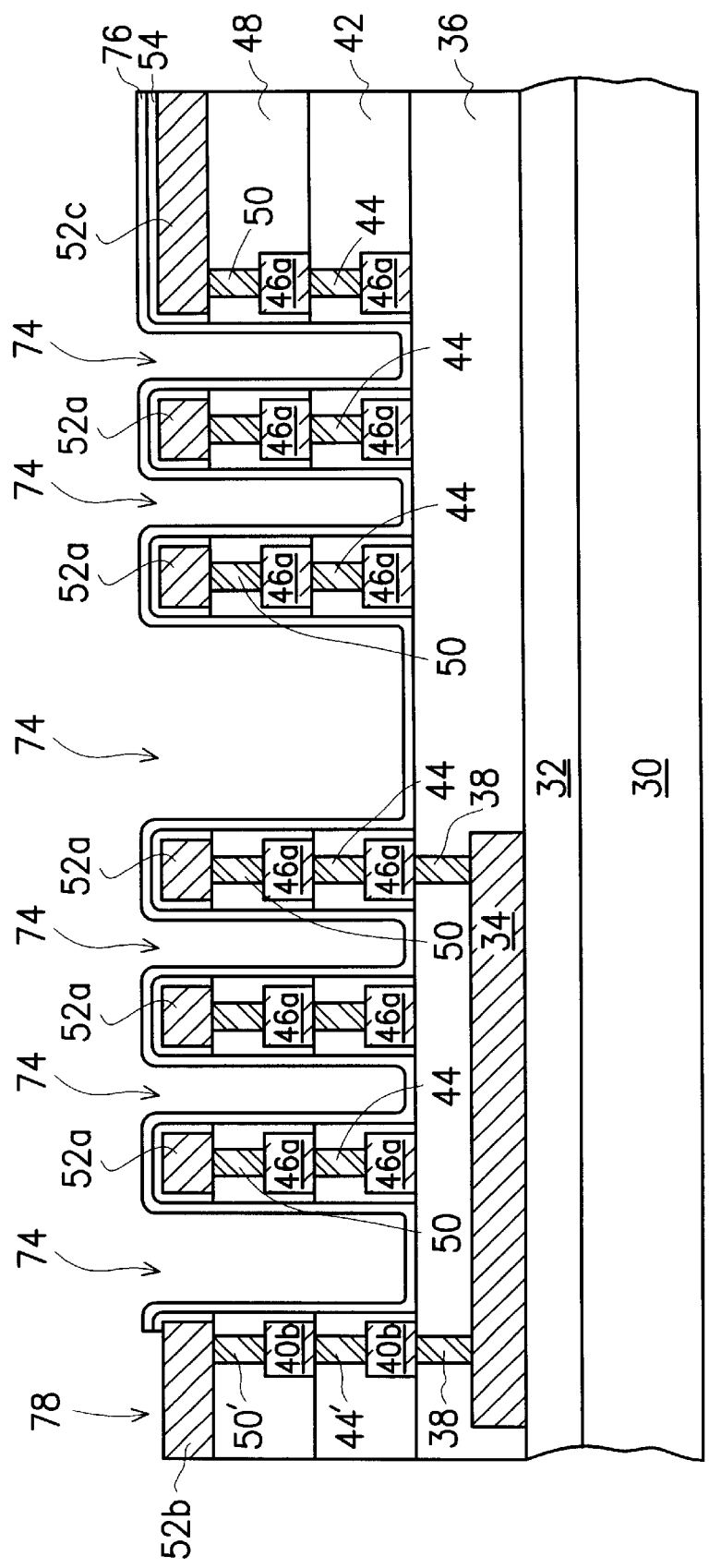

FIGS. 4A–4C show another method of forming an air trench after the step shown in FIG. 3E. Referring to FIG 4A, an oxide layer 68 is formed on the third spiral metal line 52a, the third metal line 52b, the second connective line 52c and the second dielectric layer 48 by, for example chemical vapor deposition. Thereafter, a positive photoresist 70, having a spiral trench 72 aligned with the spaced of the third spiral metal line 52a, the third metal line 52b and the second connective line 52c, is formed on the oxide layer 68 by photolithography. The spiral trench 72 keeps an appropriate distance from the third spiral metal line 52a by using the original mask for the formations of the spiral metal line 40a, 46a and 52a and by adjusting its exposure does to create a photo bias during development.

Referring to FIG. 4B, using the positive photoresist 70 as a mask, a spiral air trench 74 is formed in the oxide layer 68 and the dielectric layers 42 and 48 by etching. Then, a silicon nitride layer 76, serving as a passivation, is formed on the oxide layer 68 and the inner surfaces of the spiral air trench 74. Referring to FIG. 4C, pasts of the silicon nitride layer 76 and the oxide layer 68 just above the third metal line 52b are removed to form a trench 78 and to expose the third metal line 52b for subsequent bonding, by photolithography and etching. Thus an inductor of the invention is completely manufactured.

Figure 5A:
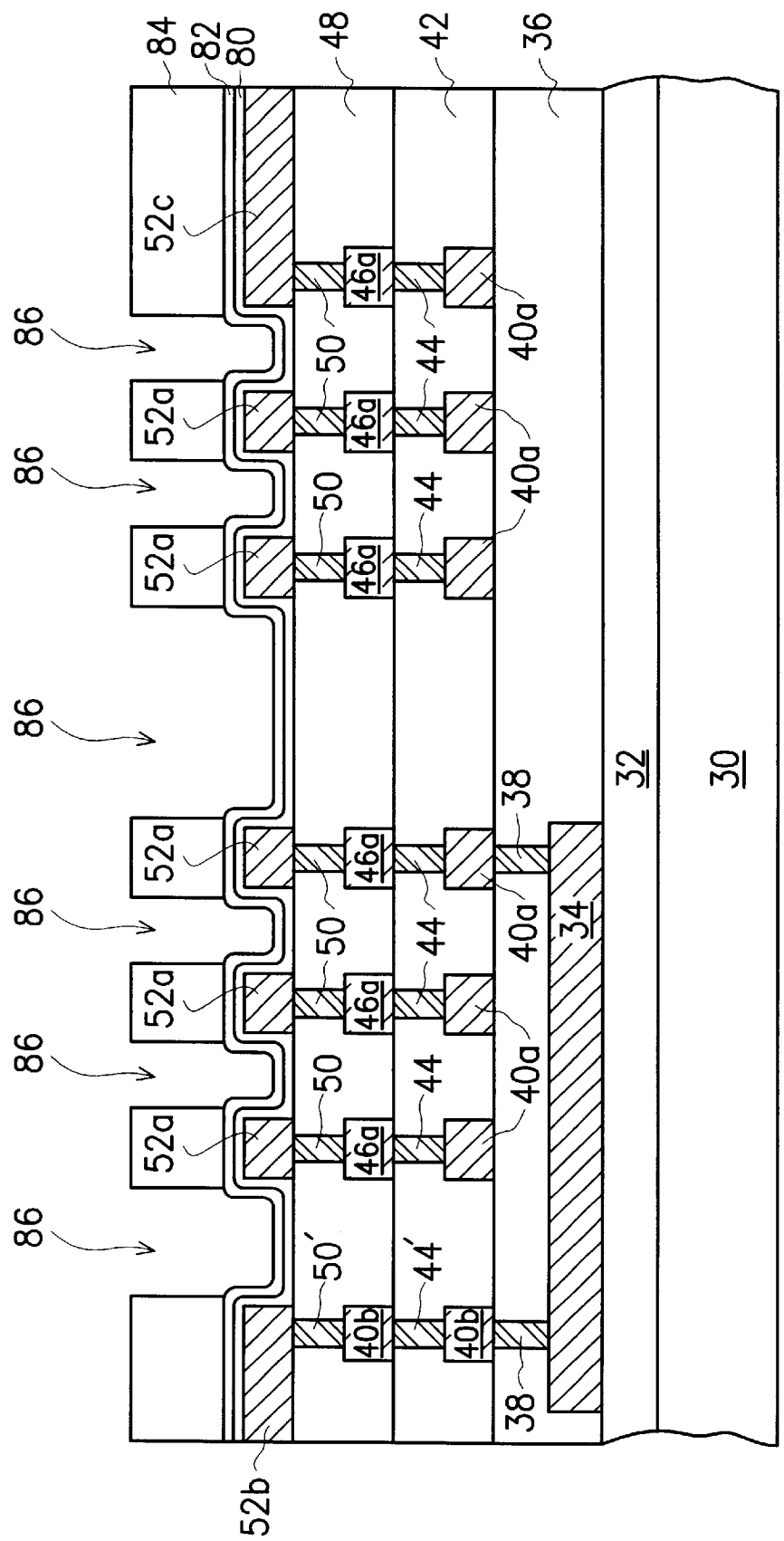
FIGS. 5A–5C are cross-sectional views illustrating a further method of forming a spiral air trench after the step shown in FIG. 3E.
Figure 5B:
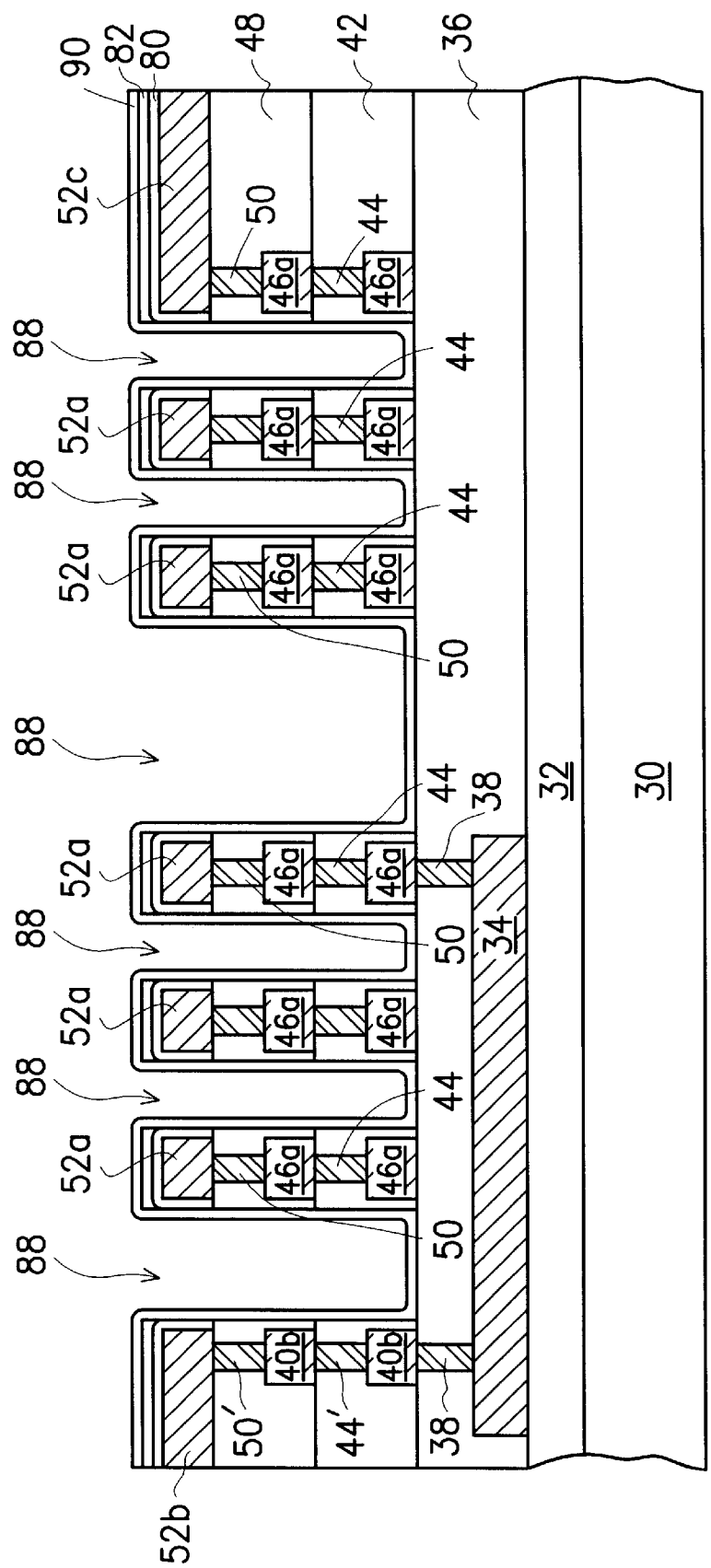
Figure 5C:
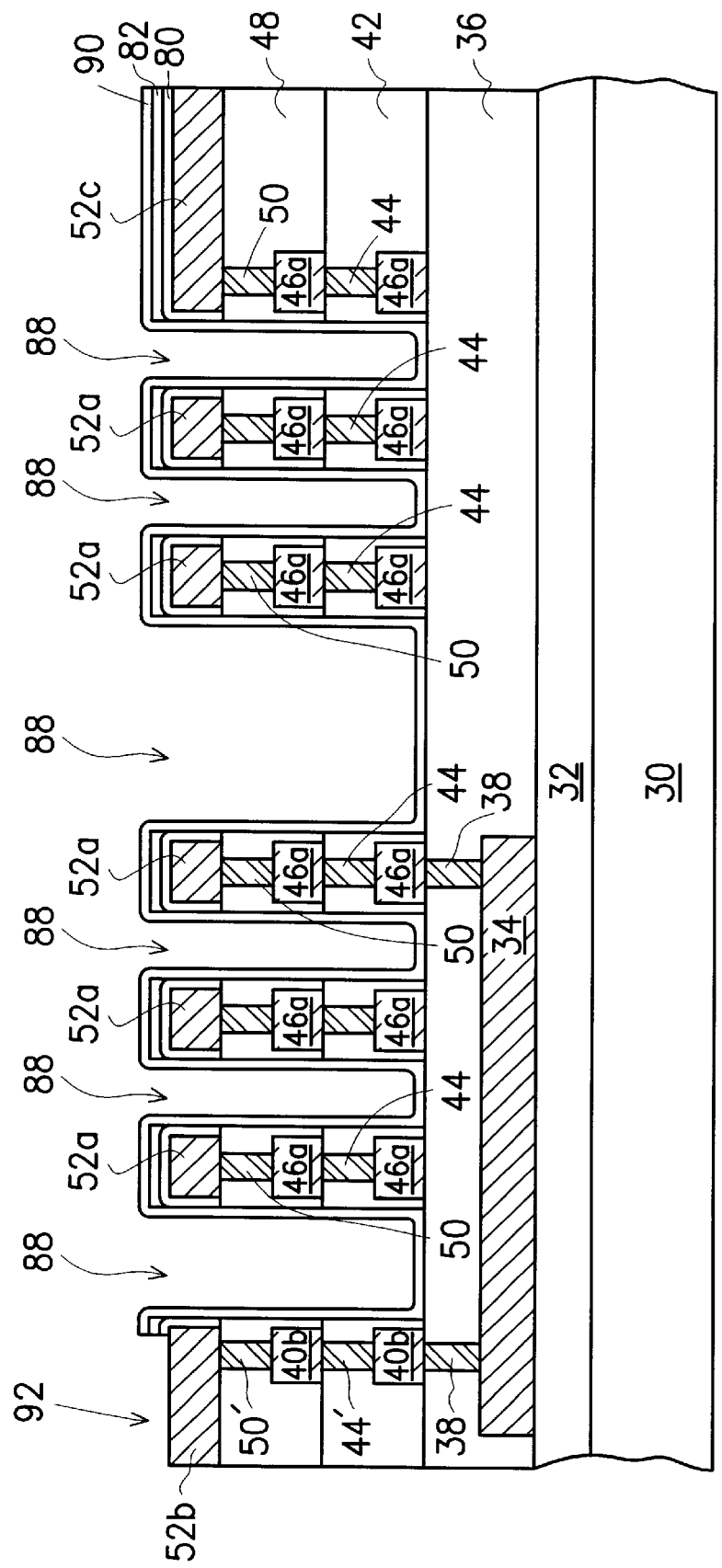

FIGS. 5A–5C show a further method of forming an air trench after the step of FIG. 3E. Referring to FIG 5A, an upper dielectric layer, consisting, for example, of a silicon oxide layer 80 and a silicon nitride layer 82, is formed on the third spiral metal line 52a, the third metal line 52b and the second connective line 52c by, for example, chemical vapor deposition. Then, a positive photoresist 84, having a spiral trench 86 aligned with the spacing of the third spiral metal line 52a, the third metal line 52b and the second connective line 52c, is formed on the silicon nitride layer 82 by photolithography. The spiral trench 86 keeps an appropriate distance from the third spiral metal line 52a by using the original mask for the formations of the spiral metal lines 40a, 46a and 52a and by adjusting its exposure does to create a photo bias during development.

Referring to FIG. 5B, with the photoresist 84 serving as a mask, an etching process is performed to form a spiral air trench 88. The photoresist 84 is removed. Next, a silicon nitride layer 90, serving as a passivation, is formed on the silicon nitride layer 82 and the inner surfaces of the spiral air trench 88. Referring to FIG 5C, parts of the silicon nitride layer 90, silicon oxide layer 82 and silicon nitride layer 80 just above the third metal line 52b are removed to form a trench 92, thereby exposing the third metal line 52b for subsequently bonding. Thus, an inductor according to the invention is completely manufactured.

As can been seen from FIG. 3H, 4C or 5C, an inductor with an air trench according to the invention at least comprises the substrate 30; the spiral metal lines 40a, 46a and 52a, and the dielectric layers including the insulator 32, the lower dielectric layer 36, the dielectric layers 42 and 48 and the upper dielectric layer. Furthermore, a plurality of via plugs 38, 44, and 50 are formed in the lower dielectric layer 36 and the dielectric layers 42 and 48 respectively, to connect the metal lines 34, 40a , 46a, and 52a to each other. The spiral air trench 66, 74, or 88 is formed in the dielectric layers 42 and 48. In addition, the inductor, which mainly includes the spiral metal line 40a, 46a and 52a, has the first connective line 34 and the second connective line 52c. A silicon nitride layer, serving as a passivation, is formed on the inner surfaces of the spiral air trench. Although the inductor is formed by 4 metal lines (including 3 spiral metal lines) and a plurality of via plug, wherein there are only 3 turns for each spiral metal line, it is well known by those skilled in the art that the number of metal lines of the inductor and the number of the turns for each spiral metal line are not limited by the embodiment at all.

Since the inductor according to the invention includes 3 spiral metal lines and a plurality of via plugs, the cross-sectional area of the inductor is increased, resulting in a decrease in the resistance thereof. Moreover, because no additional area is taken by the structure, it is much better for integration. The spiral air trench filled with air which has a lower dielectric constant ($\cong 1$) can efficiently reduce the parasitic capacitance of the inductor created. As a result, the inductor of the invention, suitable for RF circuits operating at a higher frequency, has a higher quality factor.

While the invention has been described by way of example and in terms of the preferred embodiment, it is to be understood that the invention in not limited to the disclosed embodiments. To the contrary, it is intended to cover various modifications and similar arrangements as would be apparent to those skilled in the art. Therefore, the scope of the appended claims should be accorded the broadest interpretation so at to encompass all such modifications and similar arrangements.

What is claimed is:

1. A structure of an inductor with an air trench, comprising:

a substrate;

a plurality of spiral metal lines formed over the substrate;

a plurality of dielectric layers, each of which is formed between two adjacent spiral metal lines;

a plurality of via plug formed in the dielectric layers to connect the spiral metal line to each other;

a spiral air trench formed along the spacing of the spiral metal lines in the dielectric layers;

a first connective line connecting the outer end of an upper spiral metal line.

2. The structure ass recited in claim 1, wherein each spiral metal line is a spiral aluminum layer.

3. The structure as recited in claim 1, wherein each via plug is a tungsten plug.

4. The structure as recited in claim 1, wherein each dielectric layer is a silicon oxide layer.

5. The structure as recited in claim 1, further comprising a first bonding pad connected to the first connective line and a second bonding pad connected to the second connective line.

6. The structure as recited in claim 1, wherein each spiral metal line is a square spiral metal line.

* * * * *